United States Patent
Chang et al.

(10) Patent No.: US 8,964,410 B2
(45) Date of Patent: Feb. 24, 2015

(54) TRANSFORMER WITH EXTERNALLY-MOUNTED RECTIFYING CIRCUIT BOARD

(71) Applicant: Acbel Polytech Inc., New Taipei (TW)

(72) Inventors: Shun-Te Chang, New Taipei (TW); Chien-Hua Wu, New Taipei (TW); Chia-An Yeh, New Taipei (TW); Hsiang-Yu Hung, New Taipei (TW)

(73) Assignee: Acbel Polytech Inc., New Taipei (TW)

( * ) Notice: Subject to any disclaimer, the term of this patent is extended or adjusted under 35 U.S.C. 154(b) by 133 days.

(21) Appl. No.: 13/706,536

(22) Filed: Dec. 6, 2012

(65) Prior Publication Data
US 2013/0188329 A1 Jul. 25, 2013

(30) Foreign Application Priority Data
Jan. 20, 2012 (TW) .............................. 101102565 A (51) Int. Cl.
*H05K 7/00* (2006.01)
*H05K 1/18* (2006.01)
*H01F 27/28* (2006.01)
*H05K 1/14* (2006.01)
*H05K 3/36* (2006.01)
*H01F 27/40* (2006.01)

(52) U.S. Cl.
CPC .................. *H05K 1/18* (2013.01); *H05K 1/181* (2013.01); *H01F 27/2866* (2013.01); *H05K 1/141* (2013.01); *H05K 3/366* (2013.01); *H05K 2201/1003* (2013.01); *H05K 2201/10174* (2013.01); *H01F 2027/2814* (2013.01); *H01F 2027/408* (2013.01)

USPC ............... 361/836; 336/65; 336/83; 336/123; 336/192; 336/200; 336/212; 336/223; 336/232; 361/748; 361/760

(58) Field of Classification Search
CPC ............ H01F 27/2804; H01F 27/2866; H01F 27/292; H01F 27/027; H01F 2027/065; H01F 27/324; H01F 17/043; H01F 2027/2819; H05K 1/165; H05K 2201/086
USPC .............. 361/748, 760–766, 836; 336/65, 83, 336/123, 192, 200, 212, 223, 232
See application file for complete search history.

(56) References Cited

U.S. PATENT DOCUMENTS

| | | | |
|---|---|---|---|
| 6,583,697 B2* | 6/2003 | Koyama et al. | 336/83 |
| 7,705,705 B2* | 4/2010 | Zeng et al. | 336/212 |
| 7,889,043 B2* | 2/2011 | Hsu et al. | 336/200 |
| 2007/0152795 A1* | 7/2007 | Zeng et al. | 336/212 |
| 2010/0033282 A1* | 2/2010 | Hsu et al. | 336/65 |

* cited by examiner

Primary Examiner — Hung S Bui
Assistant Examiner — James Wu
(74) Attorney, Agent, or Firm — Rosenberg, Klein & Lee (57) ABSTRACT

A transformer has two magnetic cores, at least one primary winding unit mounted in the magnetic cores, at least one secondary winding unit mounted in the magnetic cores and two rectifying circuit boards externally mounted beside the magnetic cores. An AC voltage output from the secondary winding unit is transmitted to and rectified by the rectifying circuit board. Therefore, the size of the transformer is compact, and heat energy generated by electronic elements mounted on the rectifying circuit board is effectively dissipated to maintain normal operation of the transformer. Further, since the transmission path from the secondary winding unit to the rectifying circuit board is short, energy loss is reasonably reduced when the transformer is operated under a high frequency situation or a larger current mode.

15 Claims, 11 Drawing Sheets

TRANSFORMER WITH EXTERNALLY-MOUNTED RECTIFYING CIRCUIT BOARD

BACKGROUND OF THE INVENTION

1. Field of the Invention

The present invention relates to a transformer, especially to a transformer with an externally-mounted rectifying circuit board.

2. Description of the Prior Art

With the development of IT industry, electronic device is required to be compact, multi-functional, user-friendly, etc. To manufacture a miniature electronic device, electronic elements and circuit boards applied in the electronic device should be as small as possible. For most electronic devices, the size of the electronic device mainly depends on the volume of its power supply.

Figure 10:
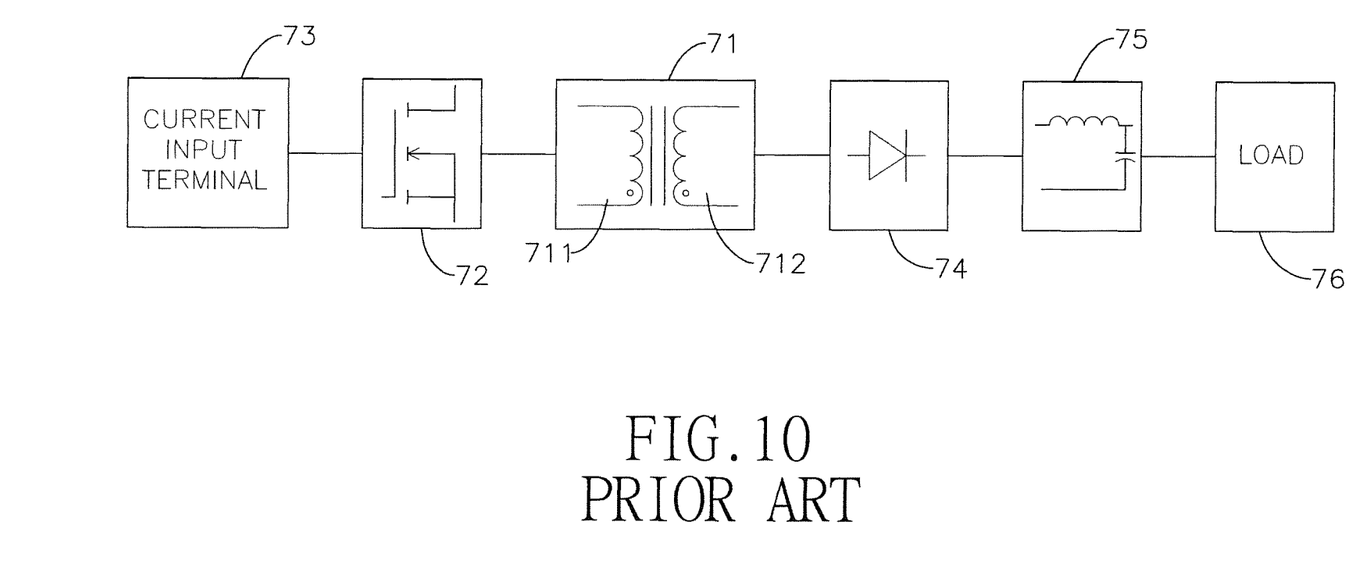
FIG. 10 is a schematic diagram of a conventional power supply.
Figure 11:
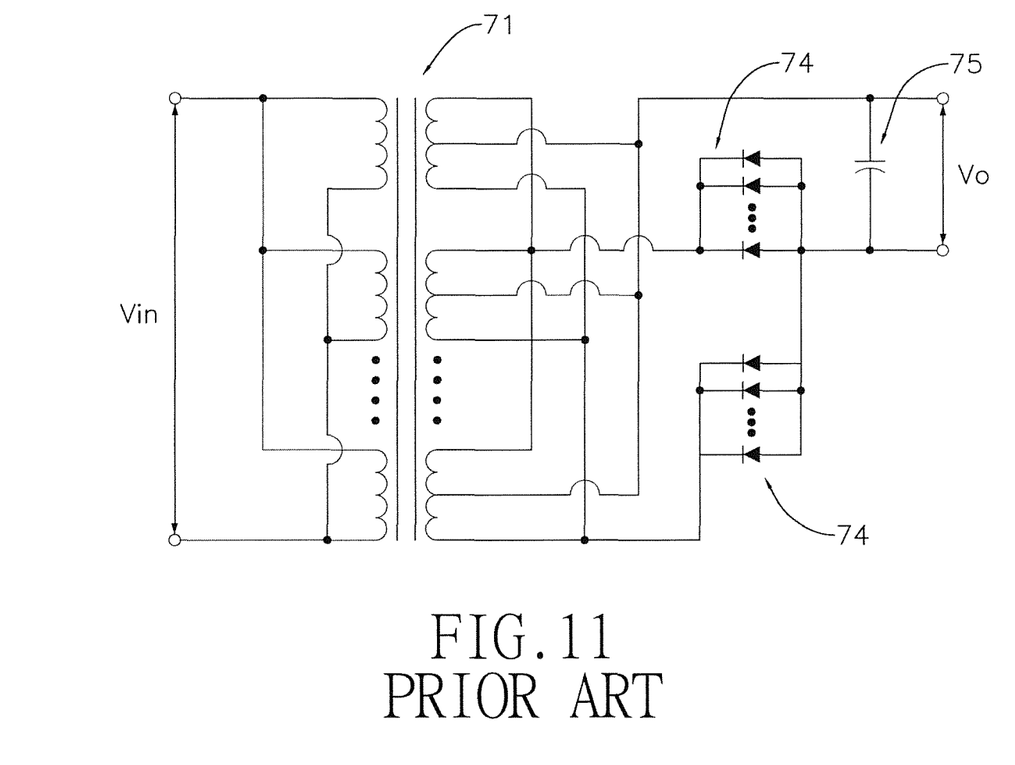
FIG. 11 is an equivalent circuit diagram of a conventional transformer in FIG. 10.

With reference to FIGS. 10 and 11, a conventional power supply includes a transformer 71. The transformer is a central tapped transformer and has a primary winding 711 and a secondary winding 712 for outputting an AC voltage. The primary winding 711 is coupled to a current input terminal 73 through a switch element 72. The secondary winding 712 is coupled to an output filter 75 through an output rectifier. The output filter 75 is for connecting to a load 76.

By increasing the switching frequency of the switch element 72, magnetic elements such as inductors and capacitors applied in the power supply can be reduced in size. However, the high frequency switching will result in the so-called skin effect and proximity effect to the wires of the transformer 71. Power loss occurs in and between the primary winding 711 and the secondary winding 712 due to the skin effect and proximity effect, especially when the transformer 71 outputs a large current.

Further, the output rectifier 74 and the output filter 75 are implemented on a circuit board of the power supply. The AC voltage output from the transformer 71 is transmitted from the secondary winding 712 to the output filter 74 through a relatively long transmission path. An impedance of long transmission path will cause significant energy loss under high frequency or large current situations. The switch element 72 also encounters the problem of switching loss. The reliability and efficiency of the transformer 71 are reduced.

The U.S. patent entitled "Transformer structure", U.S. Pat. No. 7,705,705 disclosed an improved transformer to overcome the problems mentioned above. The transformer structure has a primary winding and multiple secondary circuit units, with each secondary circuit unit having a circuit board. On the circuit board are mounted a secondary winding and an output rectifying circuit that comprises a rectifying device and a filtering device. An AC voltage output from each secondary winding is rectified and filtered by the respective rectifying device and the filtering device to produce a DC voltage. The DC voltages from all secondary circuit units are then summed up as a DC bus voltage. With the improved transformer structure, the problem of energy loss resulted from the long current transmission path can be solved.

Because the circuit boards are integrated with the transformer, the size of the transformer is very bulky. Electric device equipped with the bulky transformer accordingly has a relative large volume. Furthermore, since the circuit boards are overlapped with each other, heat dissipation for electronic elements such as the rectifying devices and the filtering devices mounted on the overlapped circuit boards is not efficient. The magnetic elements will lose their function due to the high temperature. Thus, the transformer will eventually become ineffective.

To overcome the shortcomings, the present invention provides a transformer with an externally-mounted rectifying circuit board to mitigate or obviate the aforementioned problems.

SUMMARY OF THE INVENTION

The main objective of the present invention is to provide a transformer with an externally-mounted rectifying circuit board to minimize the size and increase the heat dissipation efficiency.

The transformer has two magnetic cores, at least one primary winding unit mounted in the magnetic cores, at least one secondary winding unit mounted in the magnetic cores and at least one rectifying circuit board externally mounted beside the magnetic cores. An AC voltage output from the secondary winding unit is transmitted to and rectified by the rectifying circuit board.

Since the rectifying circuit board is externally mounted, the size of the transformer becomes more compact. The rectifying circuit board has a better heat dissipation efficiency to maintain normal operation of the transformer. Further, since the transmission path from the secondary winding unit to the rectifying circuit board is short, energy loss is reasonably reduced even though the transformer is operated under a high frequency situation or a larger current mode.

Other objectives, advantages and novel features of the invention will become more apparent from the following detailed description when taken in conjunction with the accompanying drawings.

DETAILED DESCRIPTION OF THE PREFERRED EMBODIMENTS

Figure 1:
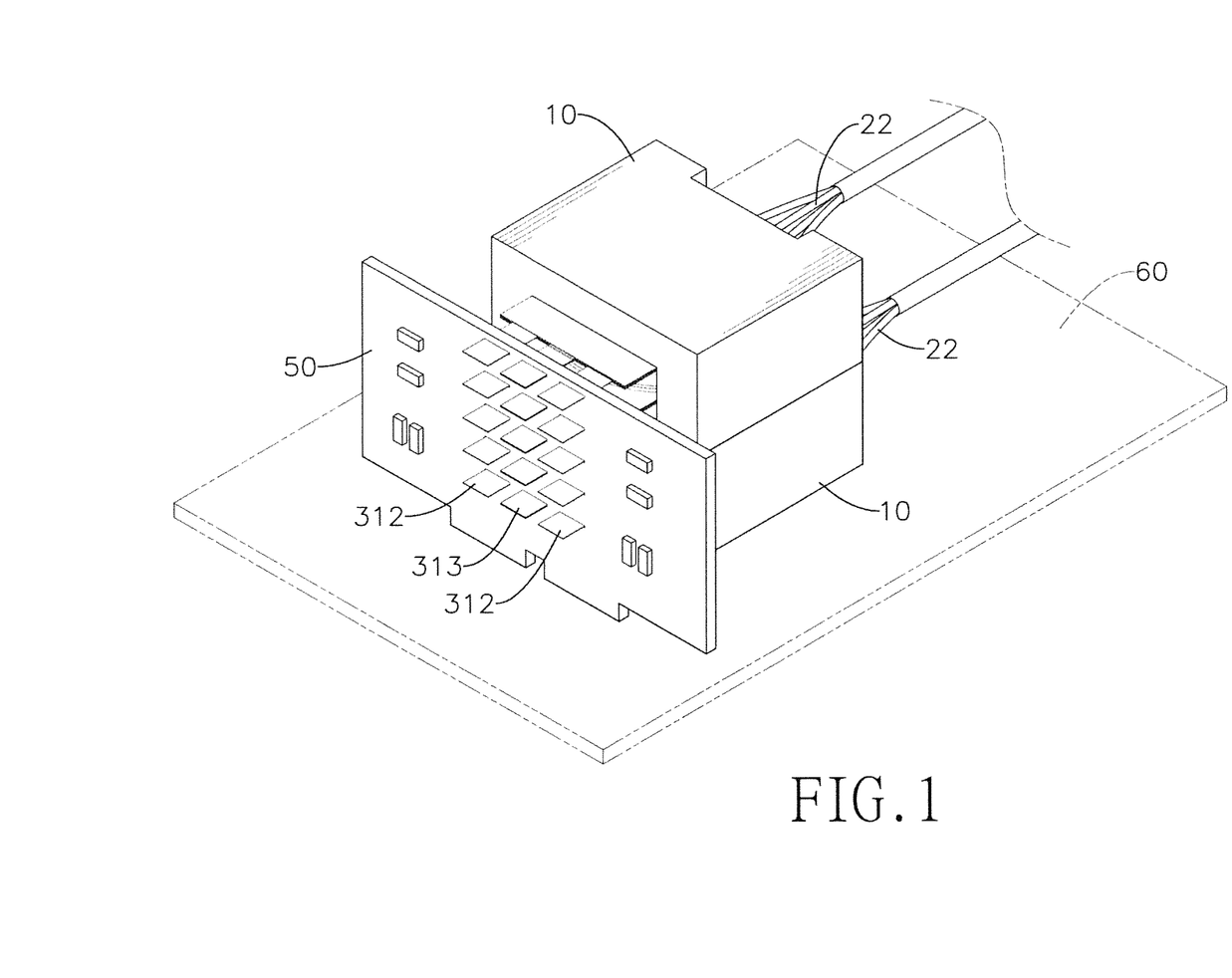
FIG. 1 is a perspective view of a first embodiment of a transformer in accordance with the present invention.
Figure 2:
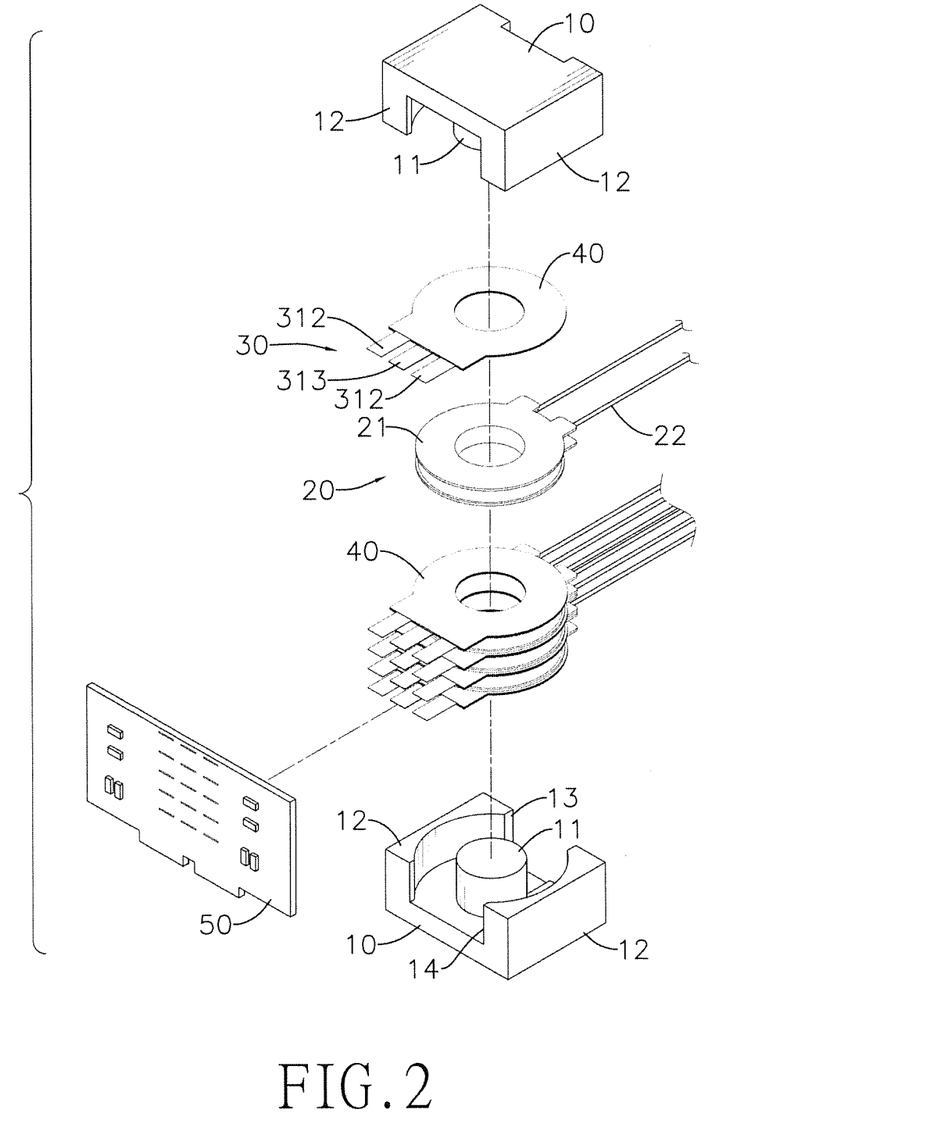
FIG. 2 is an exploded perspective view of the first embodiment of the transformer in FIG. 1.

A central tapped transformer is described hereinafter as an example for demonstrative purpose. With reference to FIGS. 1 and 2, a first preferred embodiment of a transformer in accordance with the present invention comprises two magnetic cores 10, at least one primary winding unit 20, at least one secondary winding unit 30, multiple insulation pads 40 and a rectifying circuit board 50.

The two magnetic cores 10 face each other. Each of the magnetic cores 10 has a core shaft 11, two walls 12, a first notch 13 and a second notch 14. The two walls 12 are mounted at opposite sides of the core shaft 11. The first notch 13 is formed between two sides of the two walls 12, and the second notch 14 is formed between the other sides of the two walls 12 opposite to the first notch 13. In assembling, the two magnetic cores 10 are stacked with each other, the core shaft 11 and the walls 12 of one magnetic core 10 are respectively aligned with the core shaft 11 and the walls 12 of the other magnetic core 10.

The primary winding unit 20 comprises a bobbin 21 and a primary winding 22. The bobbin 21 has a ring shape. The primary winding 22 is wound around the bobbin 21 and may comprise a coil or multiple coils. The bobbin 21 with the primary winding 22 is then mounted around the core shaft 11 in the magnetic core 10.

Figure 3:
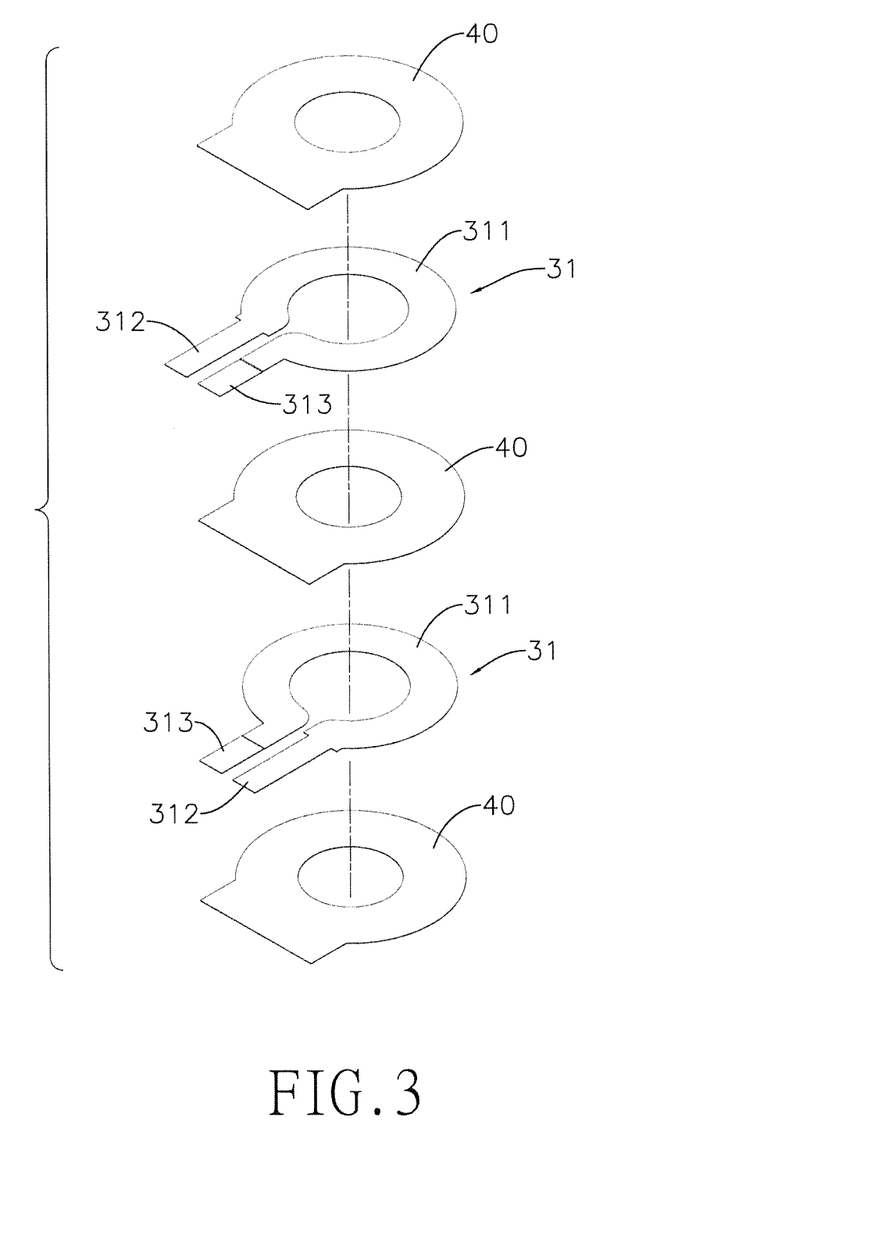
FIG. 3 is an exploded perspective view of a secondary winding unit in the first embodiment of the transformer in FIG. 1.

With further reference to FIG. 3, the secondary winding unit 30 is formed to have a central tapped configuration and is also mounted around the core shaft 11 in the magnetic core 10. The secondary winding unit 30 comprises two conductive pads 31. Each conductive pad 31 has a ring 311, a first connecting pin 312 and a second connecting pin 313. The ring 311 is mounted around the core shaft 11 of the magnetic core 10 and has two ends. The two connecting pins 312, 313 respectively extend in parallel and outwardly from the two ends of the ring 311 and are separated from each other by a gap. The second connecting pins 313 of the two conductive pads 31 are electrically connected to each other.

Each of the insulation pads 40 is substantially ring shaped. The insulation pads 40 are disposed respectively between adjacent primary winding unit 20 and secondary winding unit 30, and between adjacent conductive pads 31 of the secondary winding unit 30. All the insulation pads 40 are mounted around the core shaft 11 of the magnetic core 10.

Figure 4:
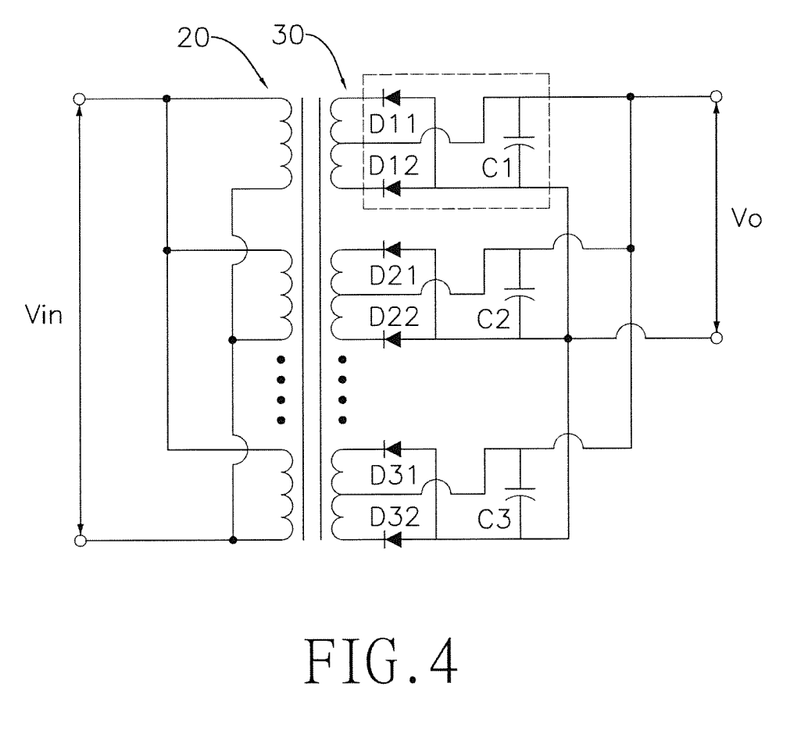
FIG. 4 is an equivalent circuit of the first embodiment of the transformer in FIG. 1.

With reference to FIG. 4, the rectifying circuit board 50 is attached beside the magnetic core 10. The rectifying circuit board 50 comprises at least one output filtering device C1, C2 and C3 and at least one output rectifying device D11, D12, D21, D22, D31 and D32. The rectifying device D11, D12, D21, D22, D31 and D32 may be diode or metal-oxide-semiconductor field-effect transistors (MOSFET). The first connecting pins 312 and second connecting pins 313 of the two conductive pads 31 extend through the rectifying circuit board 50, and connect to the respective output filtering devices C1, C2 and C3 and the output rectifying devices D11, D12, D21, D22, D31 and D32.

The rectifying circuit board 50 is adapted to be electrically mounted on a main circuit board 60 of an electronic device. An AC voltage output from each secondary winding unit 30 via the first connecting pins 312 and the second connecting pins 313 is input to the rectifying circuit board 50 and is filtered and rectified to produce a DC voltage. All the DC voltages are summed up as an operating voltage and supplied to electronic elements on the main circuit board 60.

In the first preferred embodiment mentioned above, the transformer has multiple primary winding units 20, multiple secondary winding units 30 and a rectifying circuit board 50.

The primary winding units 20 and the secondary winding units 30 are alternately overlapped. The primary winding 22 of each primary winding unit 20 extends outwardly through the first notches 13 of the magnetic cores 10 and is adapted to connect to a current input terminal. The first connecting pins 312 and the second connecting pins 313 of each secondary winding unit 30 extend through the second notches 14 opposite to the primary windings 22, wherein the second connecting pins 313 of the two conducive pads 31 are electrically connected by soldering process.

The rectifying circuit board 50 has at least one filtering device C1, C2 and C3 and multiple output rectifying devices D11, D12, D21, D22, D31 and D32. The rectifying circuit board 50 is mounted beside the second notches 14 of the magnetic cores 10 for connecting the first connecting pins 312 and the second connecting pins 313 of the secondary winding units 30 to the respective filtering devices C1, C2 and C3 and output rectifying devices D11, D12, D21, D22, D31 and D32.

In the first preferred embodiment of the transformer, since the transmission path from the first and second connecting pins 312, 313 of the conductive pads 31 to the rectifying circuit board 50 for the generated AC voltage is very short, energy loss under the high frequency or larger current operations is reduced. Further, because the AC voltage generated by each secondary winding unit 30 is transmitted to the externally-mounted rectifying circuit board 50 for rectifying, the transformer no longer uses an internal circuit board. The transformer has a more compact size and the heat energy generated by the output rectifying devices D11, D12, D21, D22, D31 and D32 and the output filtering devices C1, C2 and C3 is dissipated well to maintain the normal operation of the transformer.

Figure 5:
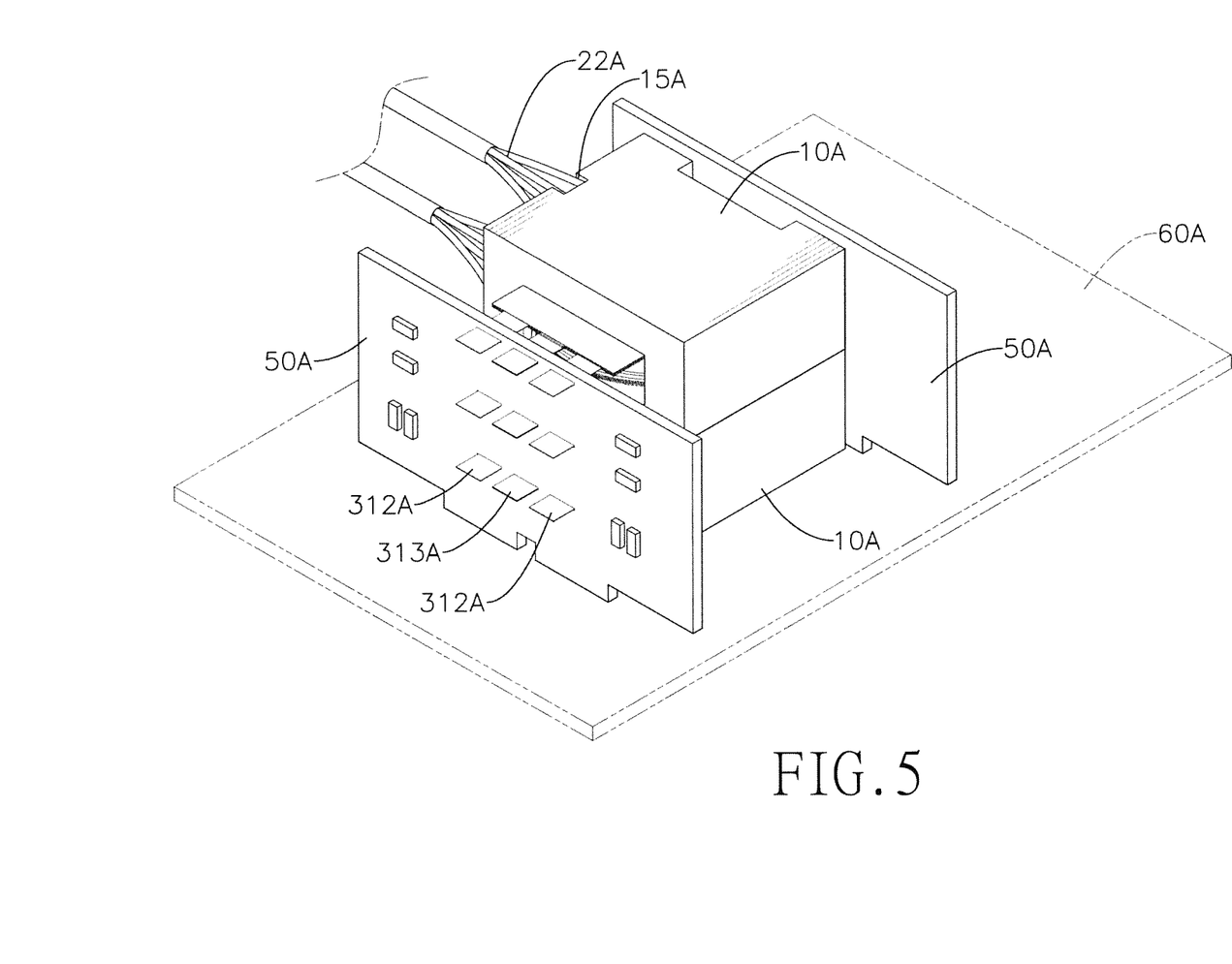
FIG. 5 is a perspective view of a second embodiment of a transformer in accordance with the present invention.
Figure 6:
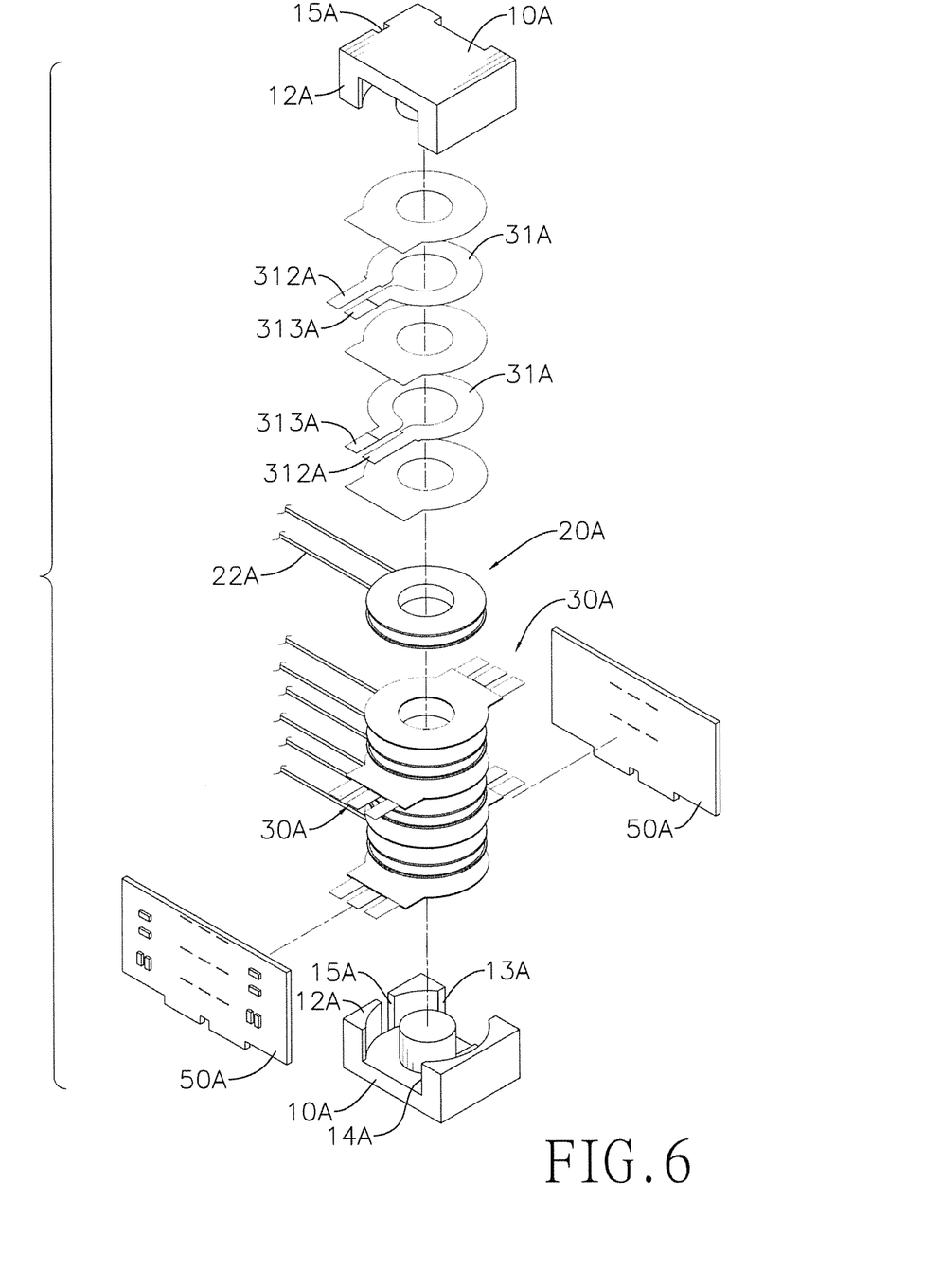
FIG. 6 is an exploded perspective view of the second embodiment of the transformer in FIG. 5.

With reference to FIGS. 5 and 6, the transformer in accordance with a second preferred embodiment of the present invention further has a third notch 15A formed through one wall 12A of each magnetic core 10A. The third notch 15A extends from a top surface of the magnetic core 10 to a bottom surface of the magnetic core. The transformer comprises multiple primary winding units 20A, multiple secondary winding units 30A and two rectifying circuit boards 50A.

The primary winding units 20A and the secondary winding units 30A are alternately overlapped. The primary winding 22A of each primary winding unit 20A extends outwardly through the third notches 15A of the magnetic cores 11A and is adapted to connect to a current input terminal. The first connecting pins 312A and the second connecting pins 313A of the secondary winding units 30A extend outwardly through the first notches 13A or the second notches 14A, wherein the second connecting pins 313A of the two conducive pads 31A of each secondary winding unit 30A are electrically connected by soldering process.

The two rectifying circuit boards 50A are respectively mounted beside the first notches 13A and the second notches 14A of the two magnetic cores 10A on the main circuit board 60A. Each rectifying circuit board 50A has at least one output filtering device C1, C2 and C3 and multiple output rectifying devices D11, D12, D21, D22, D31 and D32. Each rectifying circuit board 50 A is provided for connecting the first connecting pins 312A and the second connecting pins 313A of the secondary winding units 30A to the corresponding output filtering devices C1, C2 and C3 and output rectifying devices D11, D12, D21, D22, D31 and D32.

Because the first connecting pins 312A and the second connecting pins 313A of different secondary winding units 30A extend outwardly in opposite directions in accordance with the second preferred embodiment, the first and second connecting pins 312A, 313A of one secondary winding unit 30A are separated farther from those of another secondary winding unit 30A by a larger gap. Therefore, the heat dissipation effect is much better. The number of the output filtering device C1, C2 and C3 and the output rectifying devices D11, D12, D21, D22, D31 and D32 mounted on each rectifying circuit board 50A is reduced. The output filtering device C1, C2 and C3 and the output rectifying devices D11, D12, D21, D22, D31 and D32 may be arranged on an outer surface of the rectifying circuit board 50A. The outer surface of the rectifying circuit board 50A is opposite to an inner surface that faces toward the magnetic core 10A. Therefore, the transformer has superior heat dissipation, and checking or repairing of the transformer is easy.

In comparison to the first embodiment, the transformer of the second embodiment having the same size as the first embodiment can provide a larger output current from the secondary winding units 30A. Therefore, the transformer of the second embodiment can generate a higher output power.

Figure 7:
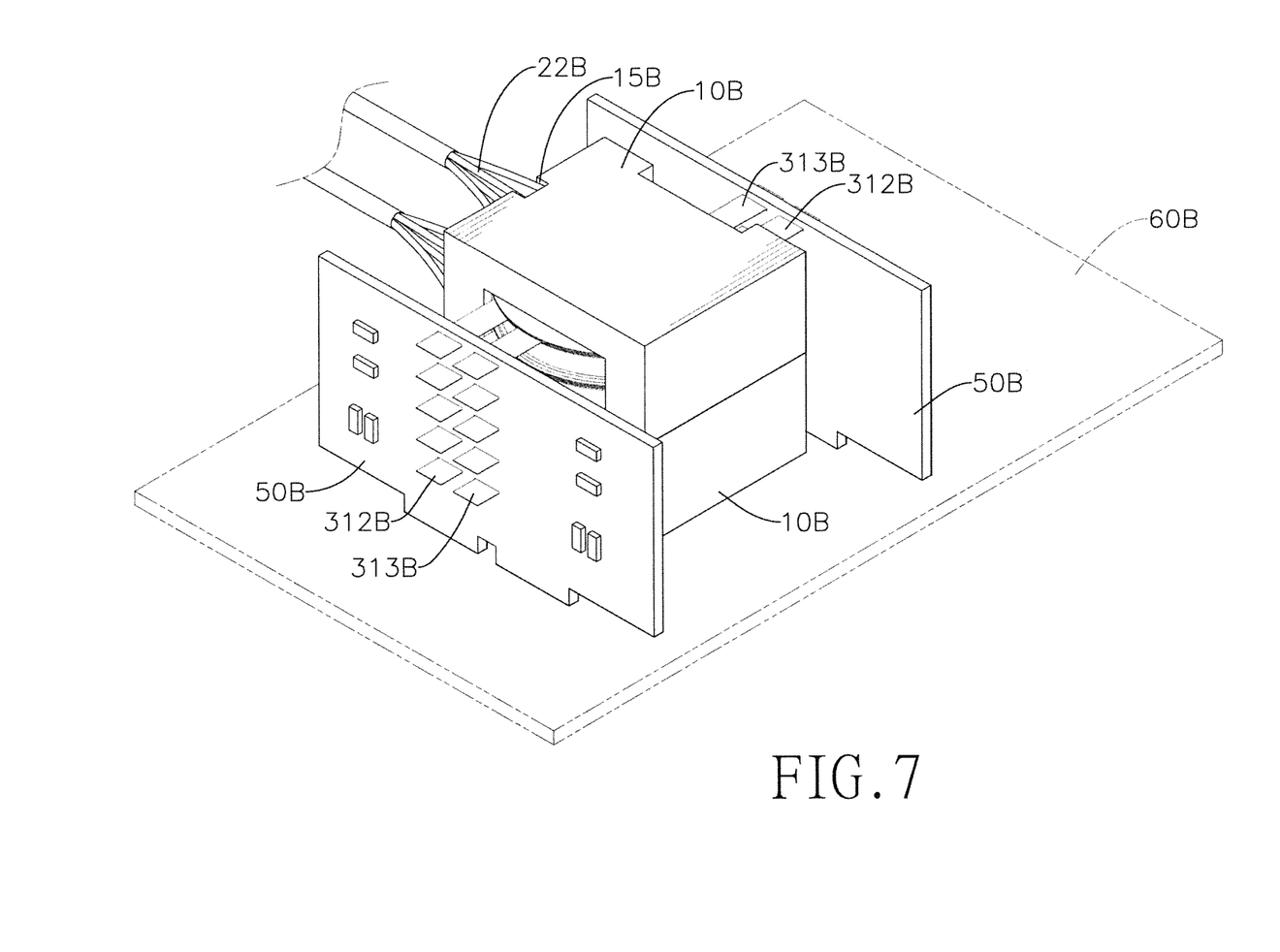
FIG. 7 is a perspective view of a third embodiment of a transformer in accordance with the present invention.
Figure 8:
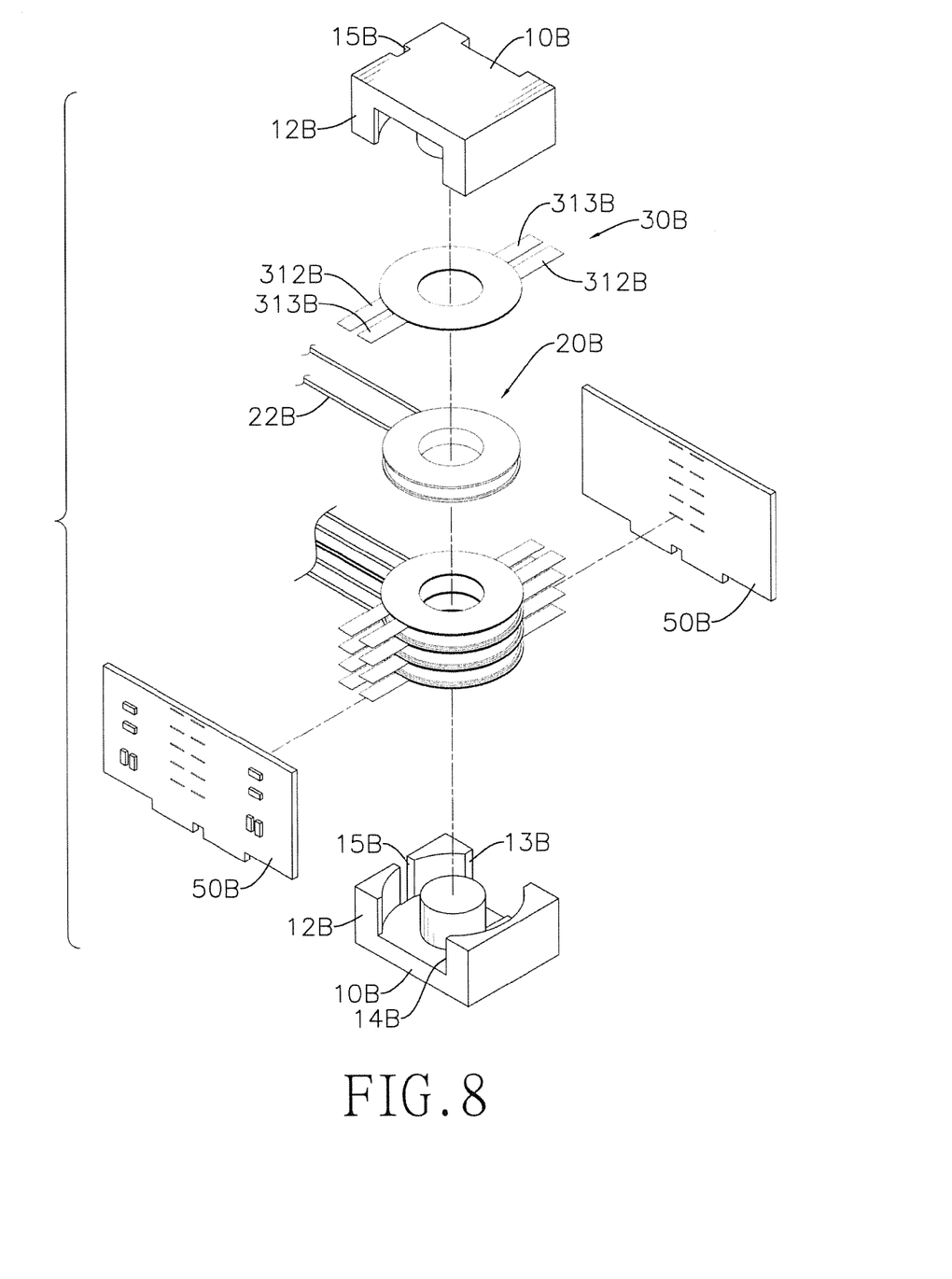
FIG. 8 is an exploded perspective view of the third embodiment of the transformer in FIG. 7.

With reference to FIGS. 7 and 8, the transformer in accordance with a third preferred embodiment of the present invention further has a third notch 15B formed through one wall 12B of each magnetic core 10B. The transformer comprises multiple primary winding units 20B, multiple secondary winding units 30B and two rectifying circuit boards 50B.

Figure 9:
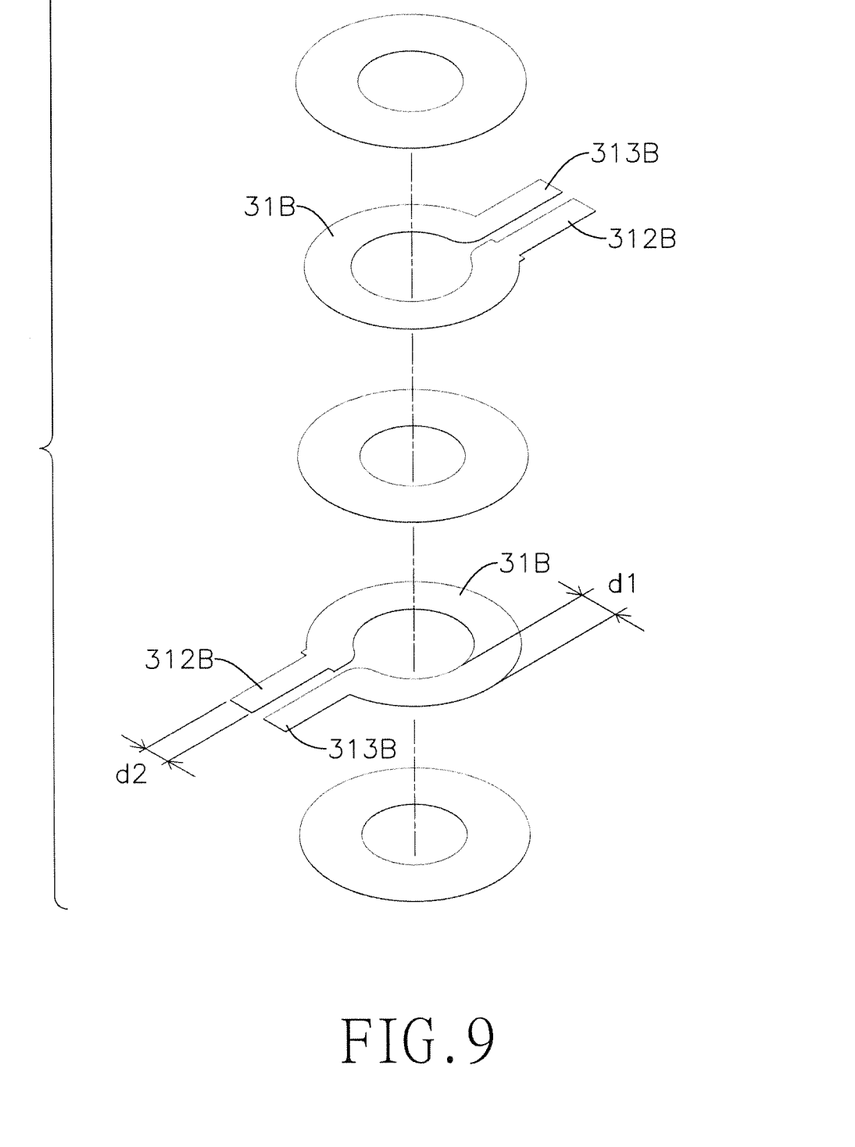
FIG. 9 is an exploded perspective view of a secondary winding unit in the third embodiment of the transformer in FIG. 7.

The primary winding units 20B and the secondary winding units 30B are alternately overlapped. The primary winding 22B of each primary winding unit 20B extends outwardly through the third notches 15B of the magnetic cores 10B and is adapted to connect to a current input terminal. With further reference to FIG. 9, the first connecting pins 312B and the second connecting pins 313B of one conductive pad 31B extend outwardly through the first notches 13B, and the first connecting pins 312B and the second connecting pins 313B of the other conductive pad 31B extend outwardly through the second notches 14B.

The two rectifying circuit boards 50B are respectively mounted beside the first notches 13B and the second notches 14B of the magnetic cores 10B. Each rectifying circuit board 50B has at least one output filtering device C1, C2 and C3 and multiple output rectifying devices D11, D12, D21, D22, D31 and D32. Each rectifying circuit board 50B is provided for connecting the first connecting pins 312B and the second connecting pins 313B of the secondary winding units 30B to the corresponding output filtering devices C1, C2 and C3 and output rectifying devices D11, D12, D21, D22, D31 and D32. The second connecting pins 313B of the two conductive pads 31B of each secondary winding unit 30B are electrically connected together through circuits formed on the main circuit board 60B of the electronic device as shown in FIG. 7.

Because only two connecting pins 312B, 313B pass through either the first notches 13B or the second notches 14B, enlarging the width d1 of the conductive pad 31B and the width d2 of each connecting pin 312B, 313B is practicable. Therefore, each conductive pad 31 is able to sustain a larger current and the energy loss may be reduced. Because the connecting pins 312B, 313B of two conductive pads 31B extend in different directions, the transformer of the third preferred embodiment has a much symmetrical configuration. Without electrically soldering the two second connecting pins 313B of the two conductive pads 31B together, assembling process of the transformer is much easier than the foregoing first and second embodiments and helps an operator avoid mistakes.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A transformer with externally-mounted rectifying circuit board, comprising:
   two magnetic cores, each magnetic core comprising
      two walls formed at opposite sides of a core shaft and separated from each other;
      a first notch formed between two sides of the two walls;
      a second notch formed between the other two sides of the two walls; and
      a third notch formed in one of the two walls;
      wherein the two core shafts of the two magnetic cores align with each other and the two magnetic cores are assembled together;
   multiple primary winding units, each primary winding unit comprising a primary winding wound around the core shafts of the magnetic cores;
   multiple secondary winding units, each secondary winding unit mounted around the core shafts of the magnetic cores and comprising at least one conductive pad, wherein each of the at least one conductive pad has
      a ring having two ends and mounted around the core shafts of the magnetic cores; and
      a first connecting pin and a second connecting pin respectively extending in parallel and outwardly from the two ends of the ring, and separated from each other by a gap; and
   two rectifying circuit boards respectively mounted beside the first notches and the second notches of the magnetic cores and opposite to each other, and adapted to be perpendicularly mounted on a main circuit board along a same direction, each rectifying circuit board comprising an output filtering device and an output rectifying device;
   wherein the first connecting pins and the second connecting pins of a part of the multiple secondary winding units are connected to the output filtering device and the output rectifying device of one of the rectifying circuit boards, and the first connecting pins and the second connecting pins of another part of the multiple secondary winding units are connected to the output filtering device and the output rectifying device of the other rectifying circuit board;
   wherein the primary windings of the primary winding units extend outward through the third notches of the magnetic cores.

2. The transformer as claimed in claim 1, wherein
   the third notch of each magnetic core extends from a top surface of the magnetic core to a bottom surface of the magnetic core; and
   the first and second connecting pins of a part of the secondary winding units extend outward through the first notches, and the first and second connecting pins of the other secondary winding units extend outward through the second notches.

3. The transformer as claimed in claim 1, wherein
   each secondary winding unit comprises a first conductive pad and a second conductive pad, wherein the first and second connecting pins of the first conductive pad extend outward through the first notches of the magnetic cores, and the first and second connecting pins of the second conductive pad extend outward through the second notches of the magnetic cores;
   the two rectifying circuit boards include a first rectifying circuit board and a second rectifying circuit board, wherein the first and second connecting pins of the first conductive pad of each secondary winding unit are connected to the output filtering device and the output rectifying device of the first rectifying circuit board; the first and second connecting pins of the second conductive pad of each secondary winding unit are connected to the output filtering device and the output rectifying device of the second rectifying circuit board.

4. The transformer as claimed in claim 1, wherein each secondary winding unit comprises two conductive pads, and the two second connecting pins of the two conductive pads are electrically connected together.

5. The transformer as claimed in claim 2, wherein each secondary winding unit comprises two conductive pads, and the two second connecting pins of the two conductive pads are electrically connected together.

6. The transformer as claimed in claim 1, wherein each primary winding unit further comprises a bobbin, the primary winding is wound around the bobbin, and the bobbin with the primary winding is mounted around the core shafts of the magnetic cores.

7. The transformer as claimed in claim 2, wherein each primary winding unit further comprises a bobbin, the primary winding is wound around the bobbin, and the bobbin with the primary winding is mounted around the core shafts of the magnetic cores.

8. The transformer as claimed in claim 3, wherein each primary winding unit further comprises a bobbin, the primary winding is wound around the bobbin, and the bobbin with the primary winding is mounted around the core shafts of the magnetic cores.

9. The transformer as claimed in claim 4, wherein each primary winding unit further comprises a bobbin, the primary winding is wound around the bobbin, and the bobbin with the primary winding is mounted around the core shafts of the magnetic cores.

10. The transformer as claimed in claim 5, wherein each primary winding unit further comprises a bobbin, the primary winding is wound around the bobbin, and the bobbin with the primary winding is mounted around the core shafts of the magnetic cores.

11. The transformer as claimed in claim 6 further comprising multiple insulation pads mounted around the core shafts of the magnetic cores, the multiple insulation pads disposed respectively between adjacent primary winding unit and secondary winding unit, and between adjacent conductive pads in the secondary winding unit.

12. The transformer as claimed in claim 7 further comprising multiple insulation pads mounted around the core shafts of the magnetic cores, the multiple insulation pads disposed respectively between adjacent primary winding unit and secondary winding unit, and between adjacent conductive pads in the secondary winding unit.

13. The transformer as claimed in claim 8 further comprising multiple insulation pads mounted around the core shafts of the magnetic cores, the multiple insulation pads disposed respectively between adjacent primary winding unit and secondary winding unit, and between adjacent conductive pads in the secondary winding unit.

14. The transformer as claimed in claim 9 further comprising multiple insulation pads mounted around the core shafts of the magnetic cores, the multiple insulation pads disposed respectively between adjacent primary winding unit and secondary winding unit, and between adjacent conductive pads in the secondary winding unit.

15. The transformer as claimed in claim 10 further comprising multiple insulation pads mounted around the core shafts of the magnetic cores, the multiple insulation pads disposed respectively between adjacent primary winding unit and secondary winding unit, and between adjacent conductive pads in the secondary winding unit.

\* \* \* \* \*